(12) United States Patent
Jang et al.

(10) Patent No.: US 8,053,841 B2
(45) Date of Patent: Nov. 8, 2011

(54) SEMICONDUCTOR DEVICE HAVING A FIN TRANSISTOR

(75) Inventors: Se-Aug Jang, Ichon-shi (KR); Heung-Jae Cho, Ichon-shi (KR); Kwan-Yong Lim, Ichon-shi (KR); Tae-Yoon Kim, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 0 days.

(21) Appl. No.: 12/698,449

(22) Filed: Feb. 2, 2010

(65) Prior Publication Data

US 2010/0133619 A1    Jun. 3, 2010

Related U.S. Application Data

(62) Division of application No. 11/965,369, filed on Dec. 27, 2007, now Pat. No. 7,682,911.

(30) Foreign Application Priority Data

Mar. 16, 2007  (KR) .................. 10-2007-0026073

(51) Int. Cl.
*H01L 21/70* (2006.01)
(52) U.S. Cl. .............. 257/369; 257/365; 257/E29.264; 257/E21.421; 438/283

(58) Field of Classification Search .................. 257/365, 257/E29.264
See application file for complete search history.

(56) References Cited

U.S. PATENT DOCUMENTS

| | | |
|---|---|---|
| 2004/0026765 A1 | 2/2004 | Currie et al. |
| 2006/0088967 A1 | 4/2006 | Hsiao et al. |
| 2007/0052037 A1* | 3/2007 | Luan ............................. 257/369 |

FOREIGN PATENT DOCUMENTS

| | | |
|---|---|---|
| KR | 1020050110081 | 11/2005 |
| KR | 1020060019470 | 3/2006 |
| KR | 1020060033232 | 4/2006 |

OTHER PUBLICATIONS

Notice of Allowance dated May 30, 2008, for Korean application No. 10-2007-0026073, citing the above references.

* cited by examiner

*Primary Examiner* — Matthew Landau
*Assistant Examiner* — Sonya McCall Shepard
(74) *Attorney, Agent, or Firm* — Lowe Hauptman Ham & Berner LLP

(57) ABSTRACT

A fin transistor includes fin active region, an isolation layer covering both sidewalls of a lower portion of the fin active region, a gate insulation layer disposed over a surface of the fin active region, and a gate electrode disposed over the gate insulation layer and the isolation layer, and having a work function ranging from approximately 4.4 eV to approximately 4.8 eV.

8 Claims, 8 Drawing Sheets

SEMICONDUCTOR DEVICE HAVING A FIN TRANSISTOR

CROSS REFERENCE TO RELATED APPLICATION

This application is a divisional of U.S. Ser. No. 11/965,369, filed on Dec. 27, 2007. This application, in its entirety, is incorporated herein by reference.

The present invention claims priority of Korean patent application number 10-2007-0026073, filed on Mar. 16, 2007, which is incorporated by reference in its entirety.

BACKGROUND OF THE INVENTION

The present invention generally relates to a fabricating technology of a semiconductor device, and more particularly, to a semiconductor device having a fin transistor and a method for fabricating the same.

Presently, since semiconductor devices have become highly integrated, typical 2-dimensional transistors encounter limitations. In that, 2-dimensional transistors are not available for high-speed devices because they cannot meet a demand for high current drivability.

To overcome such limitations, a variety of transistors having a 3-dimensional structure are being proposed, of which one is a fin field effect transistor (fin-FET, hereinafter referred to as a fin transistor). The fin transistor uses three sides as a channel to improve current drivability. On the contrary, the fin transistor is difficult to secure a threshold voltage greater than a certain level due to its three-side channels. Therefore, it is difficult to apply the fin transistor to a cell transistor of a memory device such as a dynamic random access memory (DRAM) because off-leakage characteristics are deteriorated unless securing a threshold voltage greater than a predetermined level in a memory device such as the DRAM.

Accordingly, a technique, which is capable of increasing a threshold voltage of a fin transistor, is required for employing the fin transistor as a cell transistor of the memory device. One of The techniques that has been suggested is a polysilicon layer, doped with p-type impurities such as boron (B), used as a gate electrode of the fin transistor instead of a typical polysilicon layer doped with n-type impurities such as phosphorous (P). Hereinafter, for convenience of the description, the polysilicon layer doped with p-type impurities will be referred to as a P+ polysilicon layer and the polysilicon layer doped with n-type impurities will be referred to as a N+ polysilicon layer. Theoretically, since the P+ polysilicon layer has a work function greater than N+ polysilicon layer by approximately 1.1 eV, it is possible to increase the threshold voltage of the fin transistor by a certain voltage level, e.g., approximately 0.8 V to approximately 1.0 V, by substituting the P+ polysilicon gate electrode for the N+ polysilicon gate electrode. A typical semiconductor device having such a fin transistor is illustrated in FIG. 1.

FIG. 1 illustrates a cross-sectional view of a semiconductor device having a typical fin transistor. Here, the semiconductor device, particularly a memory device, includes a cell region A and a peripheral region B. The cell region is configured with an NMOS transistor. The peripheral region B is divided into an NMOS peripheral region B1 and a PMOS peripheral region B2. A fin transistor having a typical structure is formed in the cell region A of the memory device, whereas a general planar transistor is formed in the peripheral region B.

As illustrated in FIG. 1, an isolation layer 12 is formed in a substrate 11 to define a first active region 11A in the cell region A, a second active region 11B in an NMOS peripheral region B1 of a peripheral circuit, and a third active region 11C in a PMOS peripheral region B2 of the peripheral circuit. The first, second and third active regions 11A, 11B and 11C are separated from one another by the isolation layer 12. A portion of the isolation layer 12 in the cell region A where a gate electrode will pass, is removed through masking and etching processes to form a gap G, thus exposing a top surface and portions of sidewalls of the first active region 11A. The first active region 11A vertically protrudes from the substrate 11 in virtue of the gap G. This protruding first active region serves as a fin active region in the fin transistor.

Second and third gate insulation patterns 13B and 13C and second and third gate conductive patterns 14B and 14C are sequentially formed over the second and third active regions 11B and 11C, respectively. The second gate conductive pattern 14B of the NMOS peripheral region B1 is formed of N+ polysilicon having a low work function, and the gate electrode 14C of the PMOS peripheral region B2 is formed of P+ polysilicon having a high work function.

A first gate insulation pattern 13A is formed on a surface of the exposed first active region 11A. A first gate conductive pattern 14A is formed on the first gate insulation pattern 13A and the isolation layer 12 in the cell region A such that it overlaps the gap G while crossing the first active region 11A. The first gate conductive pattern 14A in the cell region A is formed of P+ polysilicon, thus increasing the threshold voltage of the fin transistor.

However, the typical semiconductor device has several limitations below. In general, the P+ polysilicon has the work function greater than 4.8 eV and the N+ polysilicon has the work function smaller than 4.4 eV. For instance, it is assumed that there are two cases, i.e., one case where a P+ polysilicon gate having a work function of approximately 5.2 eV is formed on a gate oxide layer and an n-type junction, and the other case where an N+ polysilicon gate having a work function of approximately 4.2 eV is formed on a gate oxide layer and an n-type junction. An energy band diagram of each case is shown in FIG. 2. From these energy band diagrams, it can be observed that a band bending phenomenon becomes severe at an interface between the gate oxide layer and an n-type junction by a degree corresponding to a work function difference ($\phi_P$-$\phi_N$) between the P+ polysilicon and the N+ polysilicon in the case of using a P+ polysilicon gate electrode. Further, gate induced drain leakage (GIDL) characteristics become poorer in the case of using the P+ polysilicon gate electrode than the N+ polysilicon gate electrode, thus deteriorating data retention characteristics of a memory device. Therefore, to apply the fin transistor with improved current drivability as the cell transistor of the memory device, it is necessary to develop a technology capable of minimizing a band bending phenomenon while increasing a threshold voltage to a certain level or higher.

SUMMARY OF THE INVENTION

The present invention contemplates a semiconductor device and a method for fabricating the same, which can improve device characteristics such as gate induced drain leakage (GIDL), data retention and current drivability by securing a threshold voltage to a certain level or higher and minimizing a band bending phenomenon at an interface between a gate oxide layer and an n-type junction as well, using a material having a work function smaller than P+ polysilicon but greater than N+ polysilicon for a gate electrode of a fin transistor.

In accordance with a first aspect of the present invention, there is provided a fin transistor including fin active region, an isolation layer covering both sidewalls of a lower portion of the fin active region, a gate insulation layer disposed over a surface of the fin active region, and a gate electrode disposed over the gate insulation layer and the isolation layer, and having a work function ranging from approximately 4.4 eV to approximately 4.8 eV.

In accordance with a second aspect of the present invention, there is provided a semiconductor device including a substrate having first, second and third regions with respective active regions which are separated from one another by an isolation layer. The active region of the first region being provided as a fin active region. A gate insulation layer formed over the active regions of the first through third regions, and first, second and third gate electrodes disposed over the substrate of the first through third regions. A a fin transistor is provided in the first region, and work functions of the first through third gate electrodes are different from one another, the first gate electrode having the work function between those of the second and third gate electrodes.

In accordance with a third aspect of the present invention, there is provided a method for fabricating a fin transistor, the method includes forming an isolation layer in a substrate to define an active region, selectively etching a portion of the isolation layer where a gate electrode passes, to form a fin active region, forming a gate insulation layer over the surface of the fin active region, and forming a gate electrode over the gate insulation layer and the isolation layer, the gate electrode having a work function ranging from approximately 4.4 eV to approximately 4.8 eV.

In accordance with a fourth aspect of the present invention, there is provided a method for fabricating a semiconductor device, the method includes forming an isolation layer in a substrate having first, second and third regions, to define active regions in the first through third regions, respectively, selectively etching a portion of the isolation layer in the first region where a gate electrode passes, to form a fin active region, forming a gate insulation layer over the fin active region of the first region and the active regions of the second and third regions, thereby forming a first resultant structure, and forming first, second and third gate electrodes over the substrate of the first through third regions, wherein work functions of the first through third gate electrodes are different from one another, and the first gate electrode has the work function between those of the second and third gate electrodes.

DETAILED DESCRIPTION OF THE PREFERRED EMBODIMENTS

Figure 1:
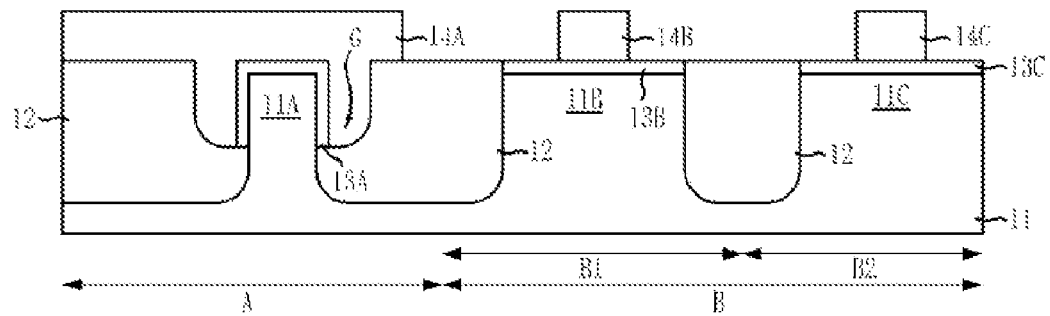
FIG. 1 illustrates a cross-sectional view of a semiconductor device having a typical fin transistor.
Figure 2:
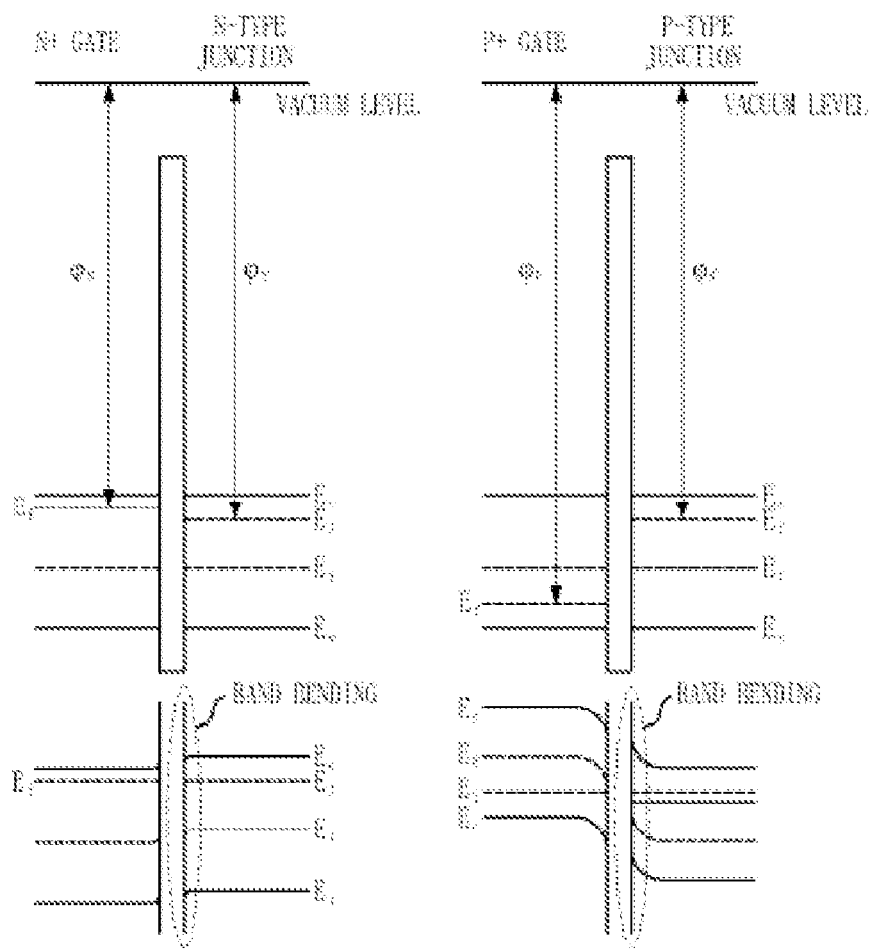
FIG. 2 illustrates energy band diagrams of the cases where N+ polysilicon and P+ polysilicon are used as a gate electrode material of the typical fin transistor, respectively.
Figure 3:
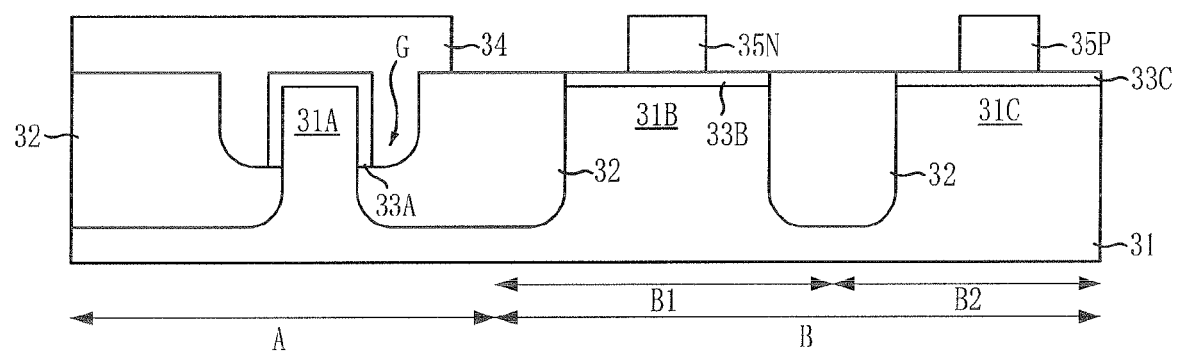
FIG. 3 illustrates a cross-sectional view of a semiconductor device having a fin transistor in accordance with an embodiment of the present invention.

FIG. 3 illustrates a cross-sectional view of a semiconductor device having a fin transistor in accordance with an embodiment of the present invention. In particular, a memory device is exemplarily illustrated hereinafter. The memory device of FIG. 3 includes a cell region A and a peripheral region B. The cell region A is configured with an NMOS transistor. The peripheral region B is divided into an NMOS peripheral region B1 and a PMOS peripheral region B2. It is preferable that a fin transistor is formed in the cell region A of the memory device. Although transistors having a variety of structures may be formed in the peripheral region B, a planar transistor is formed in the peripheral region in the present invention, for example.

Referring to FIG. 3, an isolation layer 32 is provided in a substrate 31 to define a first active region 31A in the cell region A, a second active region 31B in the NMOS peripheral region B1, and a third active region 31C in the PMOS peripheral region B2. The first, second and third active regions 31A, 31B and 31C are separated from one another by the isolation layer 32. A portion of the isolation layer 32 in the cell region A where a gate electrode will pass is removed through masking and etching processes to form a gap G, thus exposing a top surface and portions of sidewalls of the first active region 31A. The first active region 31A vertically protrudes from the substrate 31 in virtue of the gap G. This protruding first active region 31A serves as a fin active region in the fin transistor.

A first gate insulation pattern 33A is disposed over the exposed first active region 31A. A first gate conductive pattern 34 is disposed over both the first gate insulation pattern 33A and the isolation layer 32 in the cell region A such that it overlaps the recess G while crossing the first active region 31A. The first gate conductive pattern 34 of the cell region A serves as a first gate electrode. The first gate conductive pattern 34 is formed of a material having a work function smaller than P+ polysilicon but greater than N+ polysilicon, that is, in the range from approximately 4.4 eV to approximately 4.8 eV. Resultantly, it is possible to secure a threshold voltage to a certain level or higher and minimize a band bending as well, even if a fin transistor is employed in the cell region A. It is preferable that the first gate conductive layer 34A is formed of SiGe containing the content of Ge ranging from approximately 40% to approximately 70% in a thickness range from approximately 800 Å to approximately 1,200 Å.

A second gate insulation pattern 33B and a second gate conductive pattern 35N are sequentially formed over the second active region 31B in the NMOS peripheral region B1. Likewise, a third gate insulation pattern 33C and a third gate conductive pattern 35P are sequentially formed over the third active region 31C in the PMOS peripheral region B2. The second gate conductive pattern 35N includes an N+ polysilicon layer that has a work function smaller than approximately 4.4 eV and is doped with n-type impurities such as phosphorous (P) or arsenic (As). The third gate conductive pattern 35P includes a P+ polysilicon layer that has a work function greater than approximately 4.8 eV and is doped with p-type impurities such as boron (B).

Herein, the first, second and third gate conductive layers 34, 35N and 35P may further include a low-resistance conductive layer such as tungsten (W) and tungsten silicide (WSi$_x$) thereon. In the semiconductor memory device of FIG. 3, since the gate electrode of the fin transistor formed in the cell region is formed of a material having a work function between those of N+ polysilicon and P+ polysilicon, i.e., in the range of approximately 4.4 eV to approximately 4.8 eV, it is possible to improve device characteristics.

FIGS. 4A to 4I illustrate a method for fabricating the semiconductor device of FIG. 3.

Figure 4A:
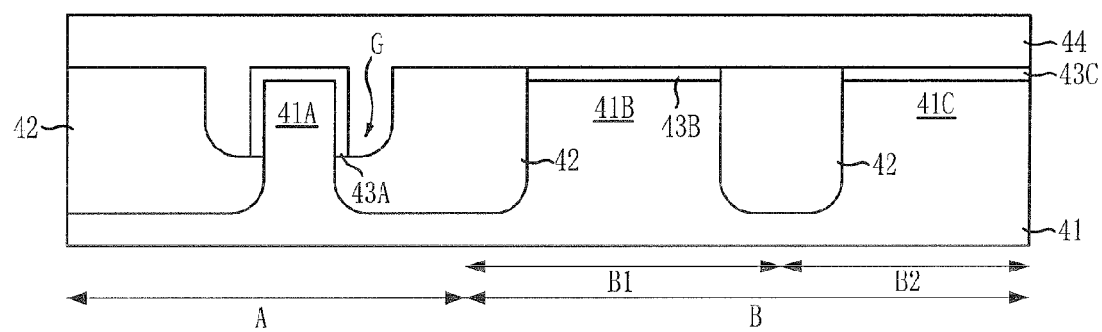
FIGS. 4A to 4I illustrate a method for fabricating the semiconductor device of FIG. 3.

Referring to FIG. 4A, an isolation layer 42 is formed in a substrate 41, thus defining a first active region 41A in a cell region A, a second active region 41B in an NMOS peripheral region B1 and a third active region 41C in a PMOS peripheral region. The isolation layer 42 may be formed through a shallow trench isolation (STI) process.

To form a fin transistor in the cell region A, a portion of the isolation layer 42 in the cell region A where a gate electrode will pass is selectively etched to form a gap G. Accordingly, a top surface and portions of sidewalls of the first active region 41A are exposed. The first active region 41A after the selective etch serves as a fin active region of a fin transistor.

A first gate interlayer insulation pattern 43A is formed on the surface of the exposed first active region 41A, a second gate interlayer insulation pattern 43B is formed over the second active region 41B, and a third gate interlayer insulation pattern 43C is formed over the third active region 41C. Thereafter, a first gate conductive layer 44 is formed of a material having a work function ranging from approximately 4.4 eV to approximately 4.8 eV over a resultant structure. Preferably, the first gate conductive layer 44A is formed of SiGe containing the content of Ge ranging from approximately 40% to approximately 70% in a thickness range of approximately 800 Å to approximately 1,200 Å.

Figure 4B:
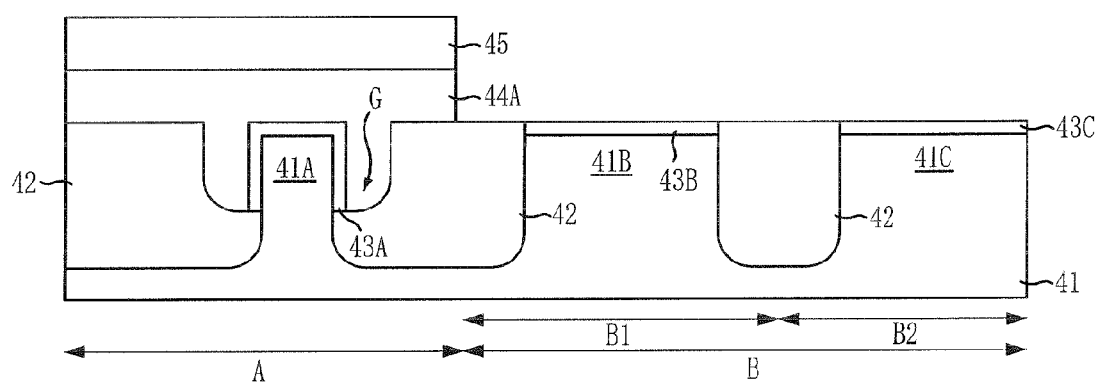

Referring to FIG. 4B, a first photoresist pattern 45 is formed over the first conductive layer 44 such that it covers the cell region A but exposes the peripheral region B. Thereafter, the first conductive layer 44 is etched using the photoresist pattern 45 as an etch mask, thus leaving a first gate conducive pattern 44A only in the cell region A.

Figure 4C:
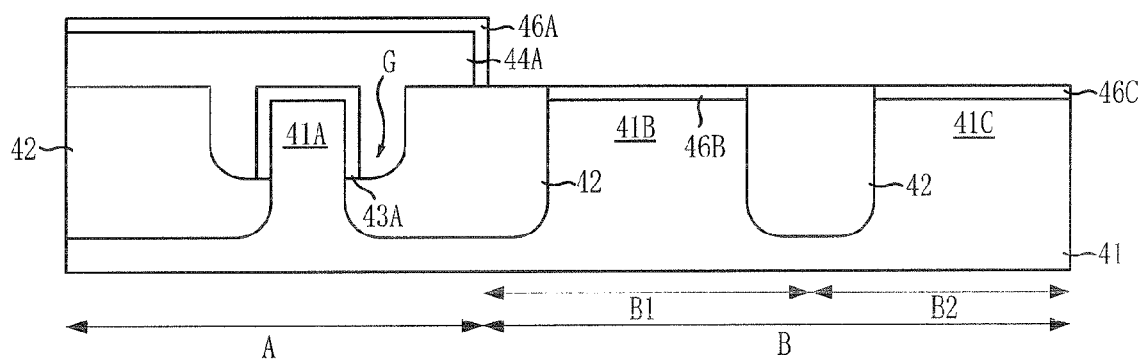

Referring to FIG. 4C, the photoresist pattern 45 and the first and second gate interlayer insulation patterns 43B and 43C are removed, and a first gate insulation pattern 46A is formed over the first gate conductive pattern 44A in the cell region A, and second and third gate insulation patterns 46B and 46C are respectively formed over the second and third active regions 41B and 41C in the peripheral region B.

Figure 4D:
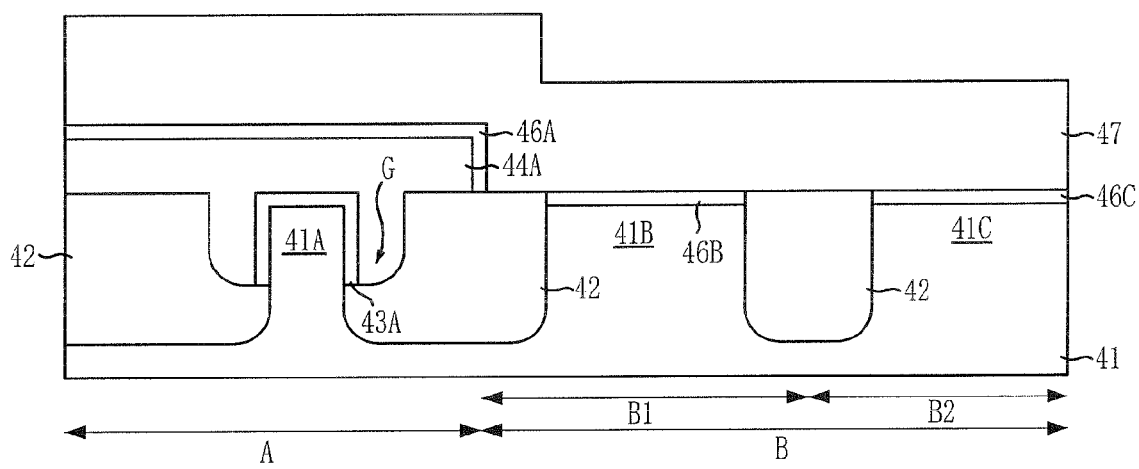

Referring to FIG. 4D, an undoped polysilicon layer 47 is formed over a resultant structure. The undoped polysilicon layer 47 is formed to a thickness ranging from approximately 1,000 Å to approximately 1,500 Å along a surface profile of the resultant structure in the cell region A and the peripheral region B.

Figure 4E:
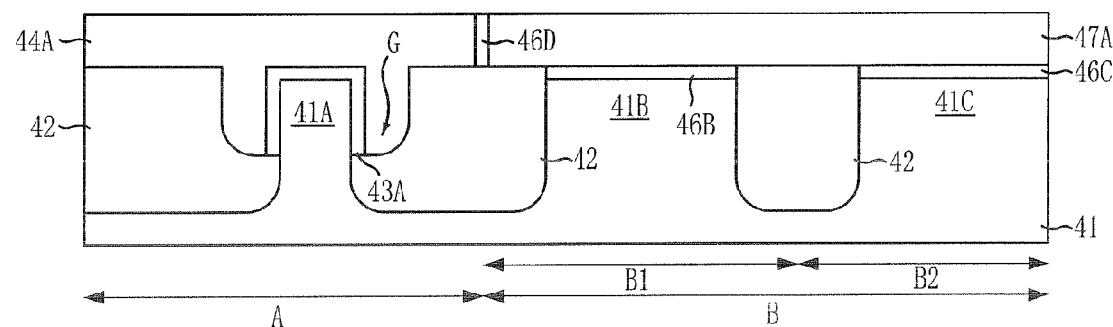

Referring to FIG. 4E, a planarization is performed to expose the surface of the first gate conductive pattern 44A of the cell region A using, for example, chemical mechanical polishing (CMP). As a result, a planarized undoped polysilicon pattern 47A is formed in the peripheral region B, which are separated from the first gate conductive pattern 44A of the cell region A by a first gate insulation bar pattern 46D.

Figure 4F:
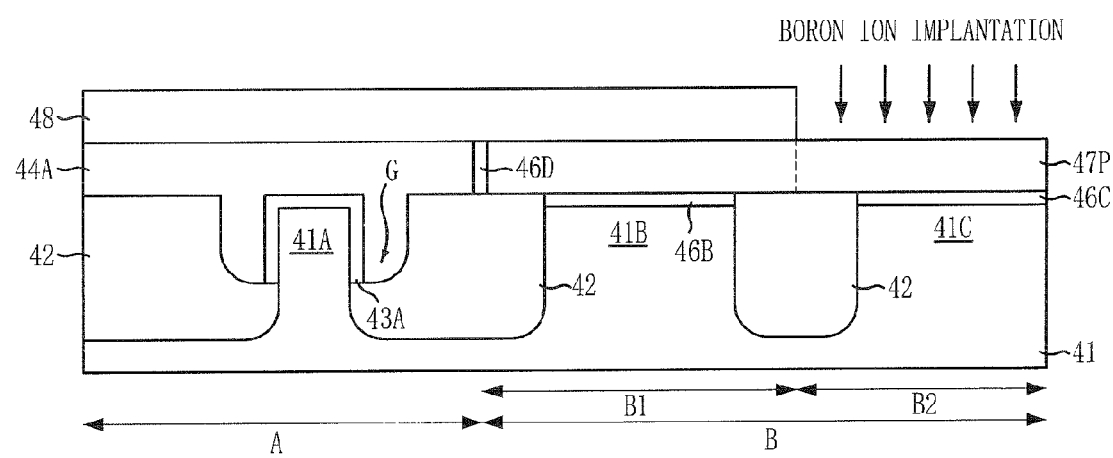

Referring to FIG. 4F, a second photoresist pattern 48 is formed over the first gate conductive pattern 44A and a portion of the planarized undoped polysilicon pattern 47A such that it covers the cell region A and the NMOS peripheral region B1 but exposes the PMOS peripheral region B2. Afterwards, p-type impurities such as boron (B) are ion-implanted by using the second photoresist pattern 48 as an ion implantation mask. Therefore, the planarized undoped polysilicon pattern 47A of the PMOS peripheral region B2 is converted into a P+ polysilicon layer doped with the p-type impurities. Hereinafter, the P+ polysilicon layer will be referred to as a third polysilicon region 47P for a third gate electrode. The P+ polysilicon layer, the third polysilicon region 47P, has a work function greater than approximately 4.8 eV.

Figure 4G:
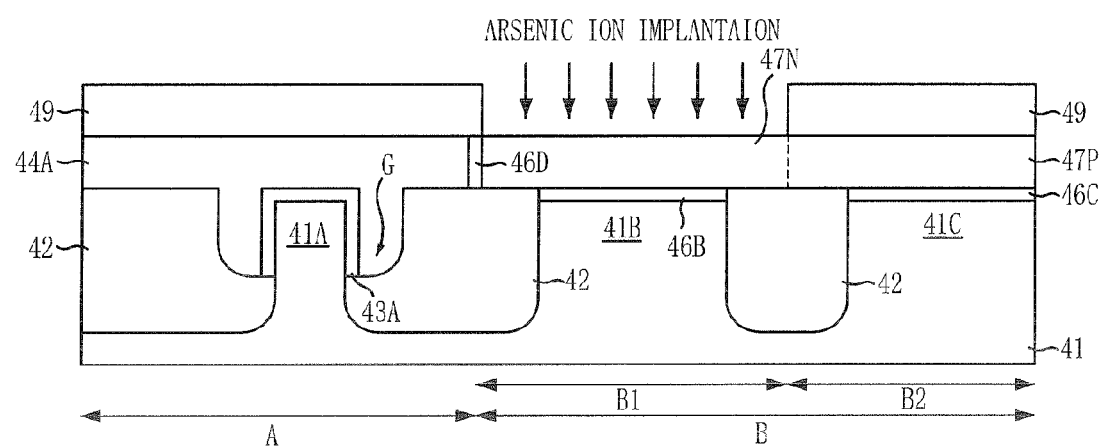

Referring to FIG. 4G, a third photoresist pattern 49 is formed over the first gate conductive pattern 44A and the third polysilicon region 47P such that it covers cell region A and the PMOS peripheral region B2 but exposes the NMOS peripheral region B1. Thereafter, n-type impurities such as arsenic (As) are ion-implanted by using the third photoresist pattern 49 as an ion implantation mask. Therefore, the planarized undoped polysilicon pattern 47A of the PMOS peripheral region B2 is converted into an N+ polysilicon layer doped with the n-type impurities. Hereinafter, the N+ polysilicon layer will be referred to as a second polysilicon region 47N for a second gate electrode. The N+ polysilicon layer, the second polysilicon region 47N, has a work function smaller than approximately 4.4 eV.

Figure 4H:
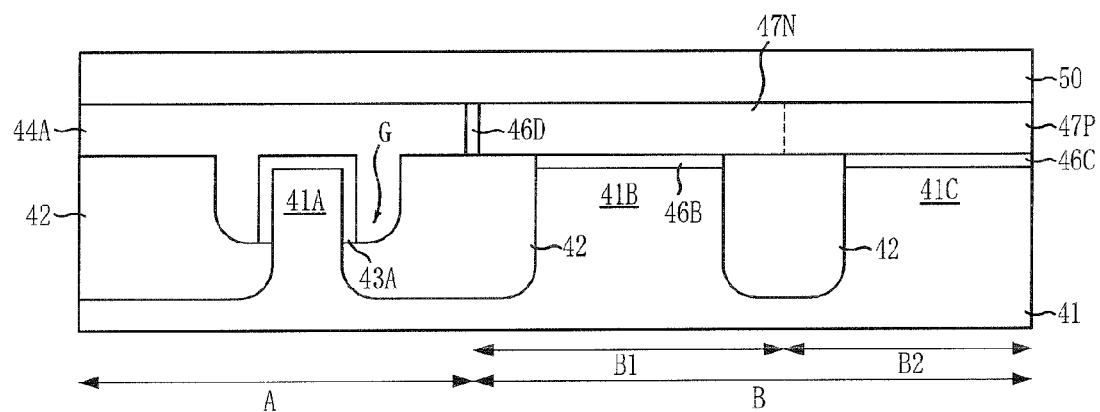

Referring to FIG. 4H, a low-resistance layer 50 is formed of tungsten (W) or tungsten silicide ($WSi_x$) over the first gate conductive pattern 44A and the second and third polysilicon regions 47N and 47P.

Figure 4I:
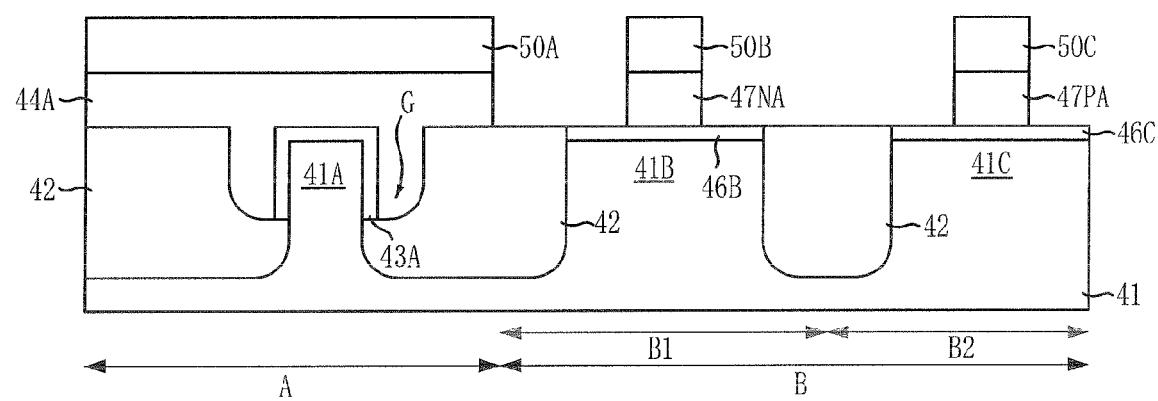

Referring to FIG. 4I, the first gate conductive pattern 44A, the second and third polysilicon regions 47N and 47P, and the tungsten (W) layer (or the tungsten silicide ($WSi_x$) layer) 50 are patterned to form gate electrodes. That is, a first gate electrode is formed in the cell region A, which is configured with a patterned first gate conductive pattern 44A and a first low-resistance pattern 50A, i.e., tungsten (W) pattern or tungsten silicide ($WSi_x$) pattern. Likewise, a second gate electrode is formed in the NMOS peripheral region B1, which is configured with a second gate conductive pattern 47NA and a second low-resistance pattern 50B, i.e., tungsten (W) pattern or tungsten silicide ($WSi_x$) pattern, and a third gate electrode is formed in the PMOS peripheral region B2, which is configured with a third gate conductive pattern 47PA and a third low-resistance pattern 50C, i.e., tungsten (W) pattern or tungsten silicide ($WSi_x$) pattern. The first gate electrode crosses the cell active region 41A and overlaps the gap G.

Consequently, a fin transistor is formed in the cell region A and a planar transistor is formed in the peripheral region B. Since the first gate conductive pattern 44A of the fin transistor has a work function between those of the second and third gate conductive patterns 47NA and 47PA, it is possible to increase the threshold voltage of the semiconductor device having the fin transistor and minimize a band bending phenomenon as well.

Although the embodiments described herein illustrate the semiconductor memory device in which the fin transistor is formed in the cell region and the planar transistor is formed in the peripheral region, the present invention is not limited to them. Hence, the present invention can be also applied to a variety of semiconductor integrated circuits besides the memory devices.

In a semiconductor device and a method for fabricating the same in accordance with the present invention, it is possible to improve device characteristics such as gate induced drain leakage (GIDL), data retention and current drivability by securing a threshold voltage to a predetermined level or higher and minimizing a band bending phenomenon at an interface between a gate oxide layer and an n-type junction as well, using a material having a work function smaller than P+ polysilicon but greater than N+ polysilicon for a gate electrode of a fin transistor.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:
1. A semiconductor device, comprising:
   a substrate including first, second and third regions having respective active regions which are separated from one another by an isolation layer, the active region of the first region being provided as a fin active region;

a gate insulation layer formed over the active regions of the first through third regions, the gate insulation layer being provided as a first resultant structure; and first, second and third gate electrodes disposed over the substrate of the first through third regions respectively, wherein a fin transistor is provided in the first region, and work functions of the first through third gate electrodes are different from one another, the first gate electrode having the work function between those of the second and third gate electrodes, and wherein the first through third gate electrodes are formed by a process comprising the steps of:

forming a silicon germanium (SiGe) layer over the first resultant structure where the gate insulation layer is formed;

removing the SiGe layer of the second and third regions through masking and etching processes, thereby forming a second resultant structure;

forming an undoped polysilicon layer along a surface profile of the second resultant structure of the first through third regions;

performing a planarization until the surface of the SiGe layer of the first region is exposed; and selectively implanting n-type impurities onto the second region, and p-type impurities onto the third region.

2. The semiconductor device of claim 1, wherein the first region is a cell region, the second region is an NMOS peripheral region, and the third region is a PMOS region.

3. The semiconductor device of claim 1, wherein the work function of the first gate electrode is in the range of approximately 4.4 eV to approximately 4.8 eV, the work function of the second gate electrode being smaller than approximately 4.4 eV and the work function of the third gate electrode being greater than approximately 4.8 eV.

4. The semiconductor device of claim 3, wherein the first gate electrode includes the silicon germanium (SiGe) layer.

5. The semiconductor device of claim 3, wherein the second gate electrode includes an N+ polysilicon layer, and the third gate electrode includes a P+polysilicon layer.

6. The semiconductor device of claim 3, wherein each of the first through third gate electrodes further comprises a low-resistance metal layer thereover.

7. The semiconductor device of claim 4, wherein the content of Ge is in the range of approximately 40% to approximately 70% in the SiGe layer.

8. The semiconductor device of claim 4, wherein the SiGe layer has a thickness ranging from approximately 800 Å to approximately 1,200 Å.

* * * * *